United States Patent
Dimroci et al.

(10) Patent No.: US 12,032,460 B2
(45) Date of Patent: Jul. 9, 2024

(54) SYSTEMS AND METHODS TO TEST AN ASYNCHRONOUS FINITE MACHINE

(71) Applicant: STMicroelectronics S.r.l., Agrate Brianza (IT)

(72) Inventors: Enea Dimroci, Borgo San Dalmazzo (IT); Francesca Giacoma Mignemi, S. Giovanni la Punta (IT); Roberta Priolo, Gravina di Catania (IT); Marco Leo, Milan (IT); Francesco Battini, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 90 days.

(21) Appl. No.: 17/670,055

(22) Filed: Feb. 11, 2022

(65) Prior Publication Data

US 2023/0259433 A1    Aug. 17, 2023

(51) Int. Cl.
*G06F 11/273* (2006.01)
*G06F 11/26* (2006.01)

(52) U.S. Cl.
CPC ............ *G06F 11/26* (2013.01); *G06F 11/273* (2013.01)

(58) Field of Classification Search
CPC .... G06F 11/26; G06F 11/273; G06F 11/2736; G06F 11/277
See application file for complete search history.

(56) References Cited

U.S. PATENT DOCUMENTS

| | | | | |
|---|---|---|---|---|
| 6,226,774 B1* | 5/2001 | Sawasaki | ................. | G06F 7/00 716/113 |
| 6,389,586 B1* | 5/2002 | McElvain | ............... | G06F 30/30 716/111 |
| 6,487,704 B1* | 11/2002 | McNamara | ........... | G06F 11/261 714/E11.167 |
| 9,772,376 B1 | 9/2017 | Kawoosa et al. | | |
| 10,310,994 B2* | 6/2019 | Stevens | ................. | G06F 13/124 |
| 11,669,666 B1* | 6/2023 | John | ....................... | G06F 30/35 716/112 |
| 2003/0188243 A1* | 10/2003 | Rajan | ............... | G01R 31/31858 714/731 |
| 2004/0153926 A1* | 8/2004 | Abdel-Hafez | ............................. | G01R 31/318544 714/726 |
| 2007/0204191 A1 | 8/2007 | Tailliet et al. | | |
| 2009/0150706 A1* | 6/2009 | Oh | ............................ | G06F 1/08 713/400 |

(Continued)

OTHER PUBLICATIONS

Inspection, Measurement and Test by Mark Dax https://dialog.proquest.com/professional/cv_2188612/docview/209607759/fulltextPDF/18DCD2F71814912B7AE/44Semiconductor International20.1: 44. Reed Business Information, a division of Reed Elsevier, Inc. (Jan. 1997) (Year: 1997).*

(Continued)

*Primary Examiner* — Joseph O Schell

(74) *Attorney, Agent, or Firm* — Slater Matsil, LLP

(57) ABSTRACT

A method to test an asynchronous finite state machine for faults, the method including disabling state transitions out of a state of the asynchronous finite state machine and inputting test data to the AFSM to trigger a transition from the state to an expected state. The method further including enabling transitions out of the state of the asynchronous finite state machine, and determining whether the asynchronous finite state machine has performed a successful transition to the expected state.

20 Claims, 10 Drawing Sheets

(56) References Cited

U.S. PATENT DOCUMENTS

| | | | | |
|---|---|---|---|---|
| 2009/0164826 A1* | 6/2009 | Kottke | ............... | G06F 11/1695 |
| | | | | 713/375 |
| 2012/0030532 A1 | 2/2012 | Jain | | |
| 2012/0233514 A1 | 9/2012 | Patil | | |
| 2014/0062606 A1* | 3/2014 | Sul | .................... | G01R 31/2884 |
| | | | | 331/46 |
| 2017/0357505 A1* | 12/2017 | Berthier | ............... | G06F 11/362 |
| 2018/0246819 A1* | 8/2018 | Stevens | .................... | H04L 7/00 |
| 2018/0321311 A1 | 11/2018 | Kawoosa | | |
| 2020/0124668 A1 | 4/2020 | Goel | | |
| 2023/0228815 A1* | 7/2023 | Bhunia | ......... | G01R 31/318536 |
| | | | | 714/726 |
| 2023/0259433 A1 | 8/2023 | Dimroci | | |

OTHER PUBLICATIONS

Henrik Hulgaard et al., "Testing asynchronous circuits: A survey," Integration, The VLSI Journal, Nov. 1, 1995, 21 pages, vol. 19, No. 3, Elsevier.

Jari Pasanen et al., "Locally Clocked AFSMs with Dynamic Latch Implementation," 6th IEEE International Conference on Electronics, Circuits and Systems, Sep. 5-8, 1999, 4 pages, vol. 3, IEEE.

Sana Rao et al., "A Search-Based Approach for Test Suite Generation from Extended Finite State Machines," 2016 International Conference on Progress In Informatics and Computing (PIC), Dec. 23, 2016, 6 pages, IEEE.

Teman, A., "Design For Test (DFT)," EnICS Labs, Bar-Ilan University, Emerging Nanoscaled Integrated Circuits and Systems Labs, Jun. 24, 2020, 56 pages.

* cited by examiner

SYSTEMS AND METHODS TO TEST AN ASYNCHRONOUS FINITE MACHINE

TECHNICAL FIELD

The present invention relates generally to methods and systems for testing asynchronous finite machines.

BACKGROUND

Testing Asynchronous Finite State Machines can be problematic. Known approaches functionally test Asynchronous Finite State Machines. However, functional testing may miss potential faults and consume much time.

SUMMARY

In accordance with an embodiment a method to test an asynchronous finite state machine (AFSM) for faults includes: disabling state transitions out of a state of the AFSM; inputting test data to the AFSM to trigger a transition from the state to an expected state; enabling transitions out of the state of the AFSM; and determining whether the AFSM has performed a successful transition to the expected state.

In accordance with an embodiment, an asynchronous finite state machine includes a state cell configured to store a value after receiving a transition signal and an ARC cell configured to produce the transition signal, the asynchronous finite state machine being configured to disable generation of the transition signal when a disable signal is received by the asynchronous finite state machine.

In accordance with an embodiment, a testing system includes: an asynchronous finite state machine (AFSM) having an initial state, the asynchronous finite state machine being configured to transition from the initial state to a destination state in response to receiving triggering data; a test register configured to provide triggering data to the AFSM during a test mode of the testing system; and an output register coupled with the AFSM to receive state signals from the AFSM that change in response a state transition of the AFSM, the AFSM being configured to disable state transition signals in response to assertion of a disable signal received by the AFSM.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Many known and emerging technologies rely on Asynchronous Finite State Machines (AFSMs). State transitions may occur quickly and efficiently. However, known methods and systems to test AFSMs involve functional testing of an AFSM. These tests are expensive in terms of time and cost. An alternative approach provides early, fast, and accurate fault detection.

In various embodiments, tests may be performed by setting the inputs to an AFSM to values known to trigger transitions and confirming that the transitions occur.

Figure 1:
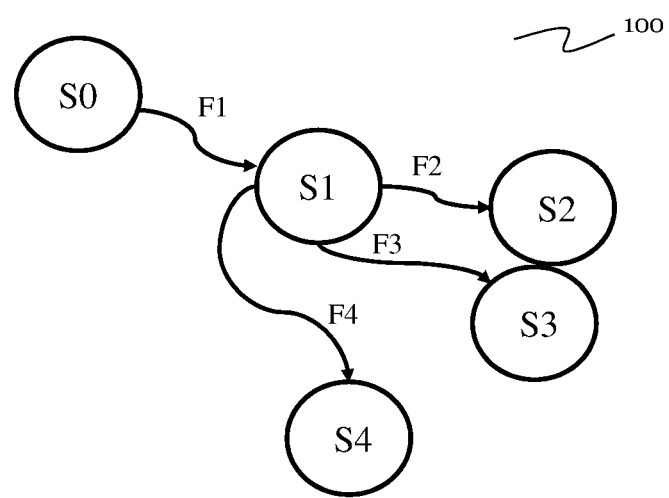
FIG. 1 shows a schematic depicting an AFSM.

FIG. 1 shows a schematic depicting an AFSM.

An AFSM 100 may comprise multiple states. For example, the AFSM depicted in FIG. 1 includes an initial state S0, a first state S1, a second state S2, a third state S3, and a fourth state S4. As will be appreciated, an AFSM may comprise any number of states.

An AFSM may transition between states when certain conditions are met. These transitions may be referred to as ARCs. When the conditions are met, ARC signals may be generated to trigger transition of the AFSM from one state to another state. It may be possible to transition out of one state by different ARCs when the corresponding conditions are met. For example, a single state may have more than one possible ARC out of the state. Likewise, a single state may have more than one possible ARC into that state.

As depicted in FIG. 1, the AFSM 100 may transition from initial state S0 to the first state in response to a first ARC signal F1. The AFSM may transition from the first state S1 to the second state S2 in response to a second ARC signal F2. The AFSM may transition from the first state S1 to the third state S3 in response to a third ARC signal F3. The AFSM may transition from the first state S1 to the fourth state S4 in response to a fourth ARC signal F4.

As will be appreciated, the ARC signals may be generated depending on inputs received by the AFSM. ARC signals may also depend on the current state of the AFSM. For example, being in the first state may be a prerequisite for an ARC out of the first state as well as input conditions.

Figure 2:
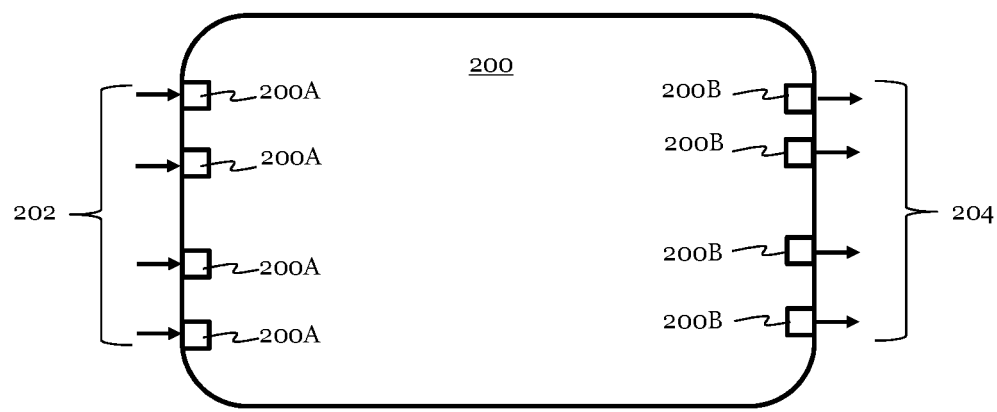
FIG. 2 illustrates inputs and outputs to an AFSM.

FIG. 2 illustrates inputs and outputs to an AFSM.

The inputs to an AFSM determine when state transitions occur. An AFSM 200 may receive input signals 202 at inputs 200A. These input signals 202 are received from other components of a device or system. For example, the input signals 202 may originate from various sensors or other components. As will be appreciated, the signals may experience various forms of processing and conversions before being transmitted to the AFSM (such as conversion into a digital signal).

The AFSM 200 may also produce state signals 204. The state signals 204 indicate the state of the AFSM 200. The state signals may also be provided to additional logic to produce outputs. The state signals may also be encoded to represent the state of the AFSM. In various embodiments, this may include one hot encoding.

Functional testing of an AFSM requires operation of a system or device to check its performance. However, it is difficult to functionally test all possible conditions to confirm operation of an AFSM. This may cause faults to be overlooked and require inordinate amounts of time. Functional testing may impose restrictions on when tests may be performed. For example, input signals may rely on other components that may need installation and testing before testing can be performed on the AFSM.

Setting the inputs an AFSM using test data provides a faster, more accurate, and more flexible testing approach.

Figure 3:
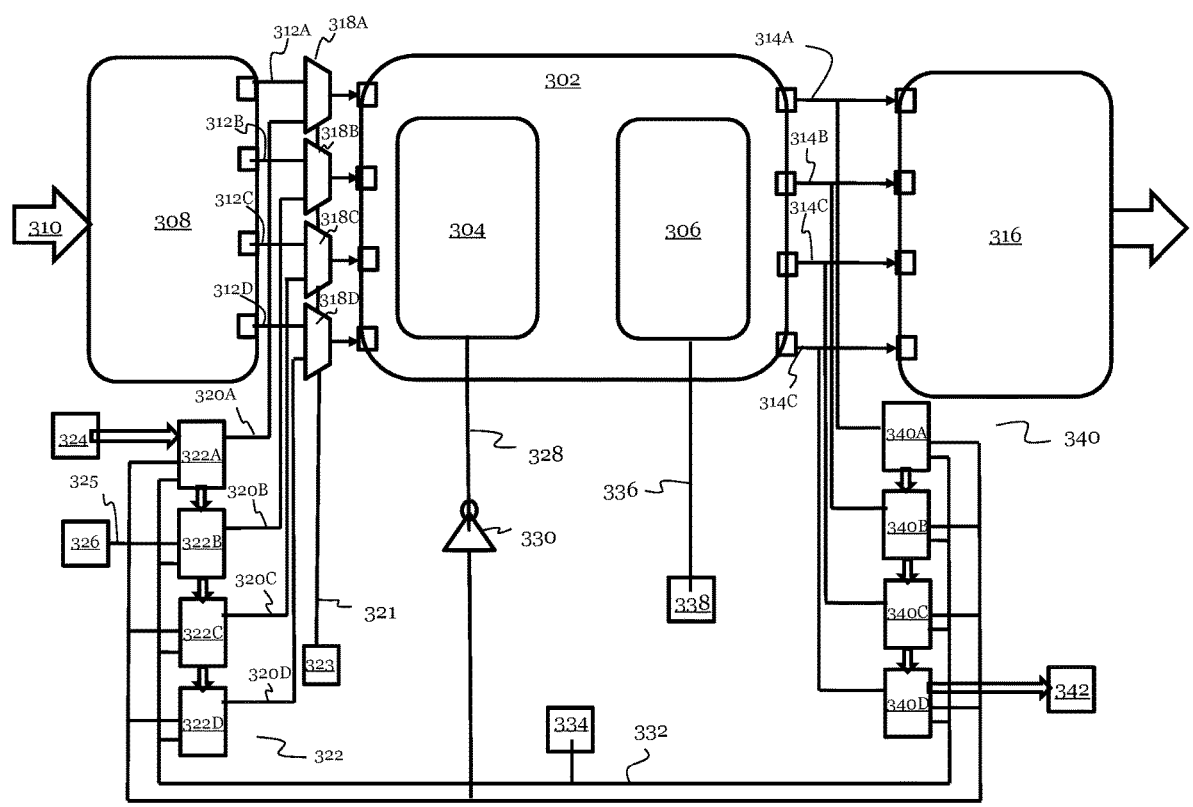
FIG. 3 depicts a system to test an AFSM in accordance with embodiments.

FIG. 3 depicts a system to test an AFSM in accordance with an embodiment.

In various embodiments, an AFSM 302 may comprise logic cells to store the state of the AFSM 302 and to trigger transitions. ARC cells 304 may trigger transitions from one state to another and state cells 306 may store states of the AFSM 302. The state cells 306 and ARC cells 304 may be coupled with each other by internal bussing.

In various embodiments, the system 300 to test an AFSM may also comprise input logic 308. The input logic 308 may define when ARC signals are produced based on functional input 310 received by the input logic 308. A given ARC signal may be triggered in response to predefined conditions being met. For example, the input logic 308 may provide a first ARC signal 312A, a second ARC signal 312B, a third ARC signal 312C, and a fourth ARC signal 312D. As will be appreciated, the conditions may be defined differently for different embodiments depending on the desired function of an AFSM. Also, the number of ARC signals may be fewer or greater in various embodiments. Further the ARC signals may be used for encoding an ARC (for example "ion" at the inputs may trigger an eleventh ARC, etc).

In various embodiments, the AFSM 302 may also output state signals that indicate the state of the AFSM 302. For example, an AFSM 302 may provide a first state signal 314A when in a first state, a second state signal 314B when in a second state, a third state signal 314C when in a third state, and a fourth state signal 314D when in a fourth state. As will be appreciated, the number of state signals may be different in various embodiments. States may also be encoded at the outputs (for example a "1011" may correspond to an eleventh state, etc).

The system 300 may also comprise output logic 316 that receives state signals from the AFSM 302 and generates output depending on the state of AFSM.

Efficient and accurate testing of an AFSM may be allowed by providing test signals to an AFSM instead of standard input. Test data that simulates the functional data may be provided at the inputs of an AFSM rather than the functional data itself. In various embodiments, test signals may be controlled and input to the AFSM to trigger transitions according to a test progression for testing the operation of an AFSM.

The system 300 may be comprise a MUX, or group of MUXes to toggle input provided to an AFSM between input provided during functional (or standard operation) and test data input. The MUX, or MUXes may receive data from functional input sources and from test-input sources (such as a test register).

In various embodiments, the system 300 may comprise a first MUX 318A that receives a first test signal 320A and the first ARC signal 312A, a second MUX 318B that receives a second test signal 320B and the second ARC signal 312B, a third MUX 318C that receives a third test signal 320C and the third ARC signal 312C, and a fourth MUX 318D that receives a fourth test signal 320D and the fourth ARC signal 312D. As will be appreciated, the number of test signals and MUXes may vary in different embodiments. The test signals (for example, first test signal 320A, second test signal 320B, third test signal 320C, and fourth test signal 320D) may provide test data to the AFSM that is triggering data to the AFSM.

The output of the MUXes may be toggled between their outputs. This may be accomplished by a test-enable signal 321 that is coupled with each of the MUXes. The test enable signal, in various embodiments, may be provided by a test controller or off-chip tester when a test of an AFSM 302 is initiated. The test-enable signal 321 may be received from a test-enable port 323 Test data can thus be provided to the AFSM instead of data provided from functional or operational sources. In this way, the system 300 may comprise a test mode. While in the test mode, test data may be provided to the AFSM 302.

In various embodiments, the system 300 may comprise a test register 322 for loading test data. Test data may be loaded into the test register from test equipment, such as a test controller or off-chip Automatic Testing Equipment ("ATE"). The test register may be coupled in in input interface 324 to receive test data. In various embodiments, the test data may be loaded into the test register one bit at a time. For example, while in a shift mode, data from test data may be loaded on a first clock pulse into a first flip-flop 322A of the test register. On a next clock pulse, this data may be shifted to a second flip-flop 322B. This may continue until test data is loaded into the test register. FIG. 3 also illustrates a third flip-flop 322C and a fourth flip flop 324D of the test register 322. It should be appreciated, however, that the test register 322 may comprise any number of flip-flops.

The test register 322 may also comprise a capture mode where data is provided to the MUXes from the flip-flops of the test register 322. For example, when receiving a capture signal data from the first flip flop 322A may be provided to the first MUX 318A, data from the second flip flop 322B may be provided to the second MUX 318B, data from the third flip flop 322C may be provided to the third MUX 318C, and data from the fourth flip flop 322D may be provided to the fourth MUX 318D. The data from the test register can thus be provided to the AFSM 302 when the system 300 is in a test mode. For example, when the test-enable signal 321 is asserted the MUXes may output data received from the test register to the AFSM 302.

The test register 322 may be toggled between modes by a selector signal. 325. The selector signal 325 may set the test register 322 to shift data. The selector signal 325 may also set the test register 322 to capture. The selector signal 325 may be received from a selection port 326. The selector signal 325 may be provided by an off chip tester. For example, an ATE or other testing equipment.

In various embodiments, the test register 322 may also receive a clock signal 332. The clock signal may be provided to the flip-flops of the test register 322. While in shift mode, the flip-flops may shift data on each clock cycle. The clock signal may be provided by off chip testing equipment in various embodiments, such as an ATE. It may be received at a clock port 334.

It may be advantageous to disable state transitions of the AFSM 302 while data is being loaded into the test register 322. This allows data to be loaded into the test register without the data triggering state transitions as it is shifted through test register. Such undesired state transitions may interfere with a desired test progression making such a test complicated, impractical, or impossible.

To freeze the state of the AFSM 302, disable signal 328 may be received by the AFSM 302. The disable signal may be asserted when data is being loaded in the test register 322 to prevent undesired transitions. In various embodiments, the disable signal 328 may be derived from the selector signal 325. For example, the selector signal 325 may be coupled with an inverter 330 to produce the disable signal 328. This may allow the AFSM 302 to be disabled whenever the test register 322 is in shift mode, thus fixing the state of the AFSM 302. This may also allow the AFSM 302 to be enabled to transition contemporaneously with the test register 322 entering a capture mode. Data input and capture of the test register 322 can thus be synchronized with disabling and enabling of the test register. As will be appreciated, in other embodiments, the disable signal 328 may also be provided independently of the selector signal 325.

In various embodiments, a reset signal 336 may also be provided to the AFSM 302. The reset signal 336 may reset the state of the AFSM 302 to an initial state or a default state. The reset signal may be provided by off chip test equipment, in various embodiments. This may include, for example, an ATE. The reset signal 336 may be received at a reset port 338.

In various embodiments, state signals from the AFSM 302 may also be provided to an output register 340. The output register 340 may be used to store the state the of the AFSM 302. The output register 340 may comprise a shift mode where data is output to an output port 342. In various embodiments, the data from the output register 340 may be output serially to the output port 342 while the output register 340 is in a shift mode. The output register 340 may receive a selection signal to toggle it between a shift mode when data is output and a capture mode when data is loaded from the AFSM 302. In various embodiments, the selector signal 325 for the test register 322 may be coupled with the output register and serve as the selection signal for the output register 340. As will be appreciated, the operation of the output register can be synchronized with the test register 322 and the AFSM 302. For example, when the test register 322 is in shift mode, the output register may also be in shift mode, and the state of the AFSM 302 may be fixed due to the disable signal 328. The state signals may then also be set, so data may be output and read accurately. This can facilitate testing of the AFSM 302. In various embodiments, output register 340 may be toggled between shift and capture states by a signal that is driven separately from the selector signal 325. Such a signal may also be synchronized with the selector signal 325, if desired.

By way of a non-limiting example, in various embodiments, the output register 34o may comprise a first output flip-flop 340A, a second first output flip-flop 340B, a third output flip-flop 340C, and a fourth output flip flop 340D. The first output flip-flop 340A may receive the first state signal 314A. The second output flip-flop 340B may receive the second state signal 314B. The third output flip-flop 340C may receive the third state signal 314C. The fourth output flip flop 340D may receive the fourth state signal 314D. The output register 340 can store the state of the AFSM 302, which can be output to the output port 342 and checked. The output port 342 may be coupled with off chip test equipment like an ATE.

Data indicating the state of the AFSM 302 may be stored in the output register. For example, when in the first state, the AFSM 302 may assert the first state signal 314A, which may be provided the first output flip-flop 340A. This can be stored and output to output port 342, which may occur by shifting data serially through the output register 340 to the output port 342. As will be appreciated the size of the output register 340 may vary.

By way of a non-limiting example, a test of an AFSM 302 may be initiated by asserting the test-enable signal 321. This may open a path for providing test data to the AFSM 302 through a MUX or group of MUXes (for example, first MUX 318A, second MUX 318B, third MUX 318C, and fourth MUX 318D). In various embodiments, the AFSM 302 may be reset to an initial or default state. This may be done using reset signal 336. The data may then be loaded into a test register 322 while the test register 322 is in a shift mode, which may be controlled by selector signal 325. The AFSM 302 may have its state fixed by disable signal 328 to prevent state changes while data is being loaded to prevent undesired state changes.

The data loaded in the test register 322 may be selected to trigger a desired transition from one state of the AFSM 302 to another state once the AFSM 302 is enabled to transition. After it is loaded, the test register 322 may toggled from a shift mode to a capture mode. Simultaneously, the selector signal 325 may enable transitions of the AFSM 302 (by way of inverter 330 in various embodiments). The test data may then trigger the internal logic of the AFSM 302 (if functioning properly) to generate the desired transition signals to cause the AFSM 302 to change states as dictated by the test data. This in turn, may cause a change in the state signal output by the AFSM 302.

The output register 340 may also receive the selector signal 325 (or an independent signal) and simultaneously be set to a capture mode when the test register 322 is set to capture mode. The output register will store the state signal output of the AFSM 302. In various embodiments, state signals may be stored in parallel in the flip-flops of an output register 340.

The test register 322 and the output register 340 may be returned to a shift mode and transitions of AFSM 302 may be disabled. This may occur, in various embodiments, by toggling the selector signal 325, which may toggle the test register 322 and the output register 340 to a shift mode and assert the disable signal 328. Data can be output from the output register 340 to indicate the state of the AFSM 302. The state of the AFSM 302 may be fixed by the disabled signal while the data is output, which may be beneficial so the state signals are not in flux as the data is being output. The state data can be compared with the expected state of the AFSM 302 to determine if the AFSM 302 is operating properly. New test data may also be simultaneously loaded into the test register 322 to test another transition of the AFSM 302. This may be repeated for all possible transitions of an AFSM 302 to test the internal components of the AFSM 302. If the simulated results, the internal logic of the AFSM may be operating appropriately without stuck-at faults.

Figure 4A:
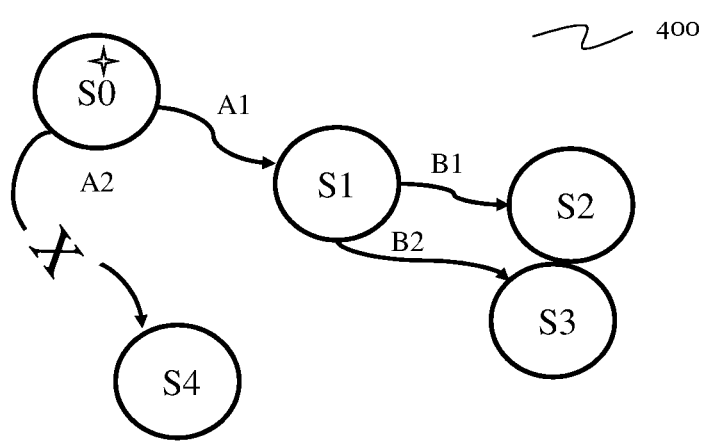
FIG. 4A depicts illustrates a step of an AFSM test in accordance with embodiments.

FIG. 4A depicts illustrates a step of an AFSM test in accordance with an embodiment.

FIG. 4A depicts a simple embodiment of finite state machine 400. This simple example is provided for illustration and should not be construed to limit application of the present disclosure. The finite state machine 400 comprises an initial state S0, a first state S1, and a second state S2, a third state S3, and a fourth state S4. The logic of the finite state machine 400 may allow a first ARC A1 out of the initial state S0, and a second ARC A2 out of the first state. The logic of the finite state machine 400 may also allow two ARCs out of the first state. A first ARC B1 to the second state S1 and a second ARC B2 to the third state.

As will be appreciated, these ARCs may be triggered by upon satisfactions of different conditions that may be defined by design of the finite state machine. When the first ARC A1 is triggered, the finite state machine 400 is configured to shift to the first state. When the second ARC A2 is triggered, the FSM may 400 may be configured to transition to the fourth state S4. When the first ARC B1 out of the first state is triggered, the AFSM may shift to the second state S2. And, when the second state is triggered the finite state machine shift to the third state S3. While in the various states, the finite state machine may output corresponding state signals, which may allow the state of the finite state machine to be compared with expected results.

For the purposes of this illustration, the finite state machine may be assumed to be in the initial state. This is denoted by a star in the initial state S0. Test data may be input to the finite state machine 400 to satisfy the conditions to transition out of the first state S1 on the first ARC A1. As the test data is loaded, the finite state machine may be inhibited from transitioning out of the initial state by a disable signal. Once the disable signal is de-asserted, the test data will trigger the finite state machine transition to the first state S1. The second ARC is blocked with an "X" in FIG. 4A to illustrate that the first ARC A1 has been triggered.

The state of the finite state machine may once again be fixed by assertion of a disable signal, which may then lock the finite state machine in the first state.

Figure 4B:
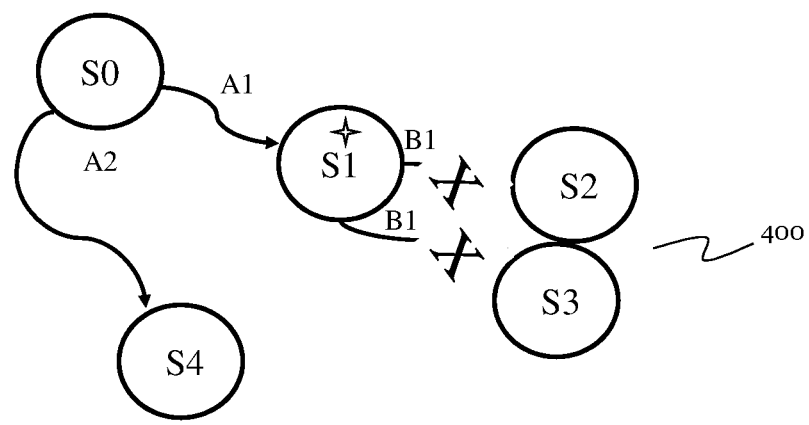
FIG. 4B illustrates a finite state machine locked in a given state in accordance with embodiments.

FIG. 4B illustrates a finite state machine locked in a given state in accordance with an embodiment.

After transition, the finite state machine 400 is now in the first state S1, denoted by a star in FIG. 4B. The disable signal may be asserted again to lock the finite state machine in the first state S1. The state signals may then be checked to determine if the finite state machine 400 operated as expected and transitioned to the first state S1. More test data may also be input to perform further testing without inadvertently triggering a transition. This may occur simultaneously as data is being output from an output register that stores the value of the stage signals.

Figure 5:
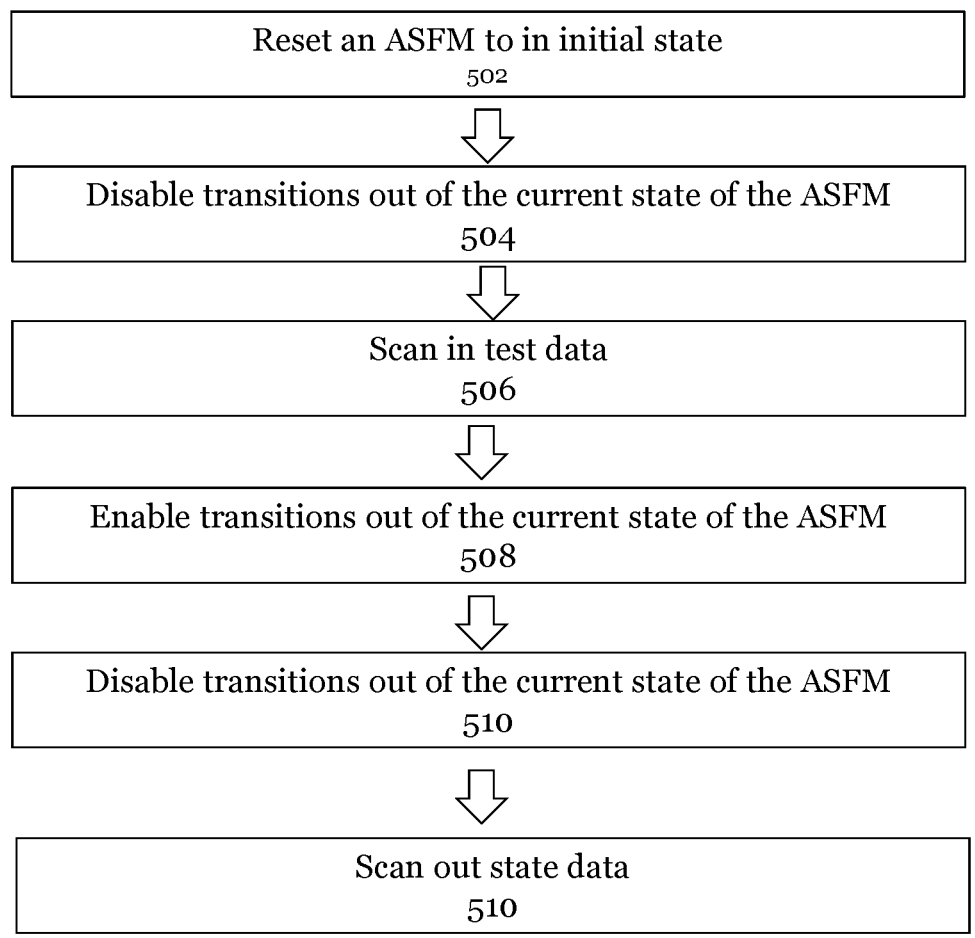
FIG. 5 depicts a method to test a transition of an asynchronous finite state machine in accordance with embodiments.

FIG. 5 depicts a method to test a transition of an asynchronous finite state machine.

In various embodiments, the method 500 may comprise at a step 502 resetting an asynchronous finite state machine to in initial state. This may be accomplished in various embodiments using a reset signal 336. At a step 504, the method may comprise disabling transitions out of the current state of the asynchronous state machine. This may be accomplished in various embodiments with a disable signal 328. At a step 506 in various embodiments, the method 500 may further comprise scanning in test data to trigger transition out of the current state. In various embodiments, this may comprise setting a test register to a shift mode and serially loading data into the test register.

In various embodiments, the method may comprise at a step 508, enabling transitions of the asynchronous finite state machine. This may be accomplished be de-asserting the disable signal. At a step 510, in various embodiments the method 500 may comprise, inhibiting transitions of the asynchronous finite state machine. This may be accomplished be asserting the disable signal, again. And, in various embodiments, the method 500 may comprise at a step 512 scanning out data reflecting the state of the asynchronous state machine. This may comprise serially outputting data from an output register that stores state signals received from an asynchronous finite state machine. This data may be compared with the expected state of the asynchronous finite state machine. And, these states may be repeated until all desired transitions are checked. If the state transitions occur as expected, it may demonstrate that an AFSM operates as intended and there is an absence of "stuck-at" faults in the digital logic making up the AFSM.

In various embodiments, the ARC cells 304 and the state cells 306 may comprise arrangements of logic components. AFSM tests of this disclosure can identify stuck-at faults in the components.

Figure 6:
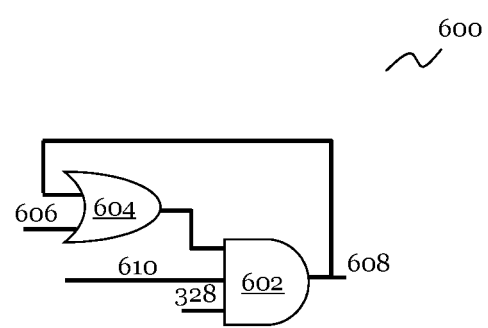
FIG. 6 depicts an ARC cell in accordance with embodiments.

FIG. 6 depicts an ARC cell in accordance with an embodiment.

As will be appreciated, an ARC cell may comprise different forms in different embodiments. FIG. 6 depicts but one example of an ARC cell 600. The ARC cell 600 may comprise an AND gate 602 and an OR gate 604. An ARC Signal 606 may be provided to an input the OR gate 604. The source for the ARC signal may depend on whether a test has been enabled. For example, ARC signals may be received from the output of a MUX (such as the first MUX 318A, second MUX 318B, third MUX 318C, or fourth MUX 318D). And, the output of the MUXes may depend on the test-enable port 323. When a test is being performed, the ARC Signal 606 may be functional or simulated test data for triggering a transition of the ARC signal where it is delivered.

The output of the AND gate 602 may comprise a transition signal 608. The transition signal may be coupled with an input of a state Cell. The transition signal 608 may also be fed back to the input of the OR gate 604. The AND gate 602 may also receive a confirmation signal 610 that reflects whether the AFSM 302 is in the appropriate state for assertion of a transition signal out that ARC cell 600. The confirmation signal 610 may comprise a signal that enables the arcs out of the current state, so that a transaction can be triggered starting from the current state, and the arcs out of all the other state may be disabled through this signal 610.

In various embodiments, the AND gate 602 of the ARC cell 600 may be coupled with the disable signal 328. This may allow disable signal 328 to block production of a transition signal 608. For example, in various embodiments, the test register 322 may be set to a shift mode by setting the selector signal 325 to a "1." This may be inverted by inverter 330 and provided to the input of the AND gate 602, which can inhibit any transition signal 608. In various embodiments, each ARC cell 600 of an AFSM 302 may be disabled from presenting transition signals, which will freeze the state of the AFSM. It should be appreciated that this represents but one approach to freezing the state of the AFSM (disabling transitions). In various embodiments, transitions may be disabled by at the state cells rather than the ARC cells.

Figure 7:
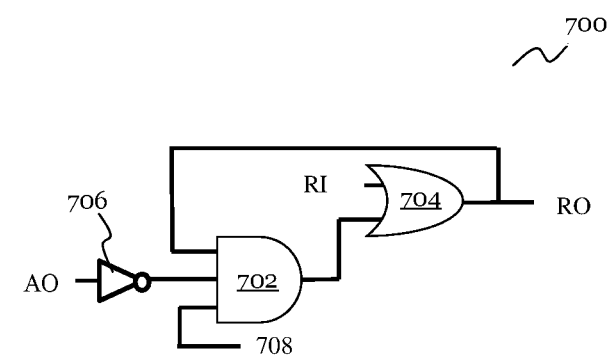
FIG. 7 depicts a state cell in accordance with embodiments.

FIG. 7 depicts a state cell in accordance with an embodiment.

As will be appreciated, state cells may implemented in different ways in various embodiments. FIG. 7 represents but one example. The state cell 700 may comprise an OR gate 704. The OR gate 704 may receive an input signal RI. The input signal RI may be asserted when a trigger signal from a corresponding ARC cell 600 is asserted. In some cases, multiple trigger signals can trigger a transition to a given state so the input sign RI may be asserted when any one of the relevant trigger signals is generated. This may be accomplished by inputting the trigger signals into an OR gate, the output of which is provided to the OR gate 704 as input signal RI. The OR gate 704 may provide an output RO of the state cell 700.

The state cell 700 may comprise and AND gate 702 and an OR gate 704. The AND gate may receive an acknowledgement signal that is used to indicate if an AFSM is another state. The state cell may also comprise an inverter 706. The AND gate may also receive a RESET signal 708, which may reset the state cell 700 from an asserted state. In various embodiments, the RESET signal may comprise reset signal 336. The state cell 700 may be used to store a state of an AFSM 302. So, an output RO of the OR gate is feedback to the AND gate. This allows the output RO of the state cell 700, once asserted by a trigger signal, to maintain its state unless another state cell is asserted (which is indicated by the Acknowledgement signal AO) and no reset is signaled by the RESET signal 708. The output of the AND gate 702 may also be coupled with an input of the OR gate 704.

Figure 8:
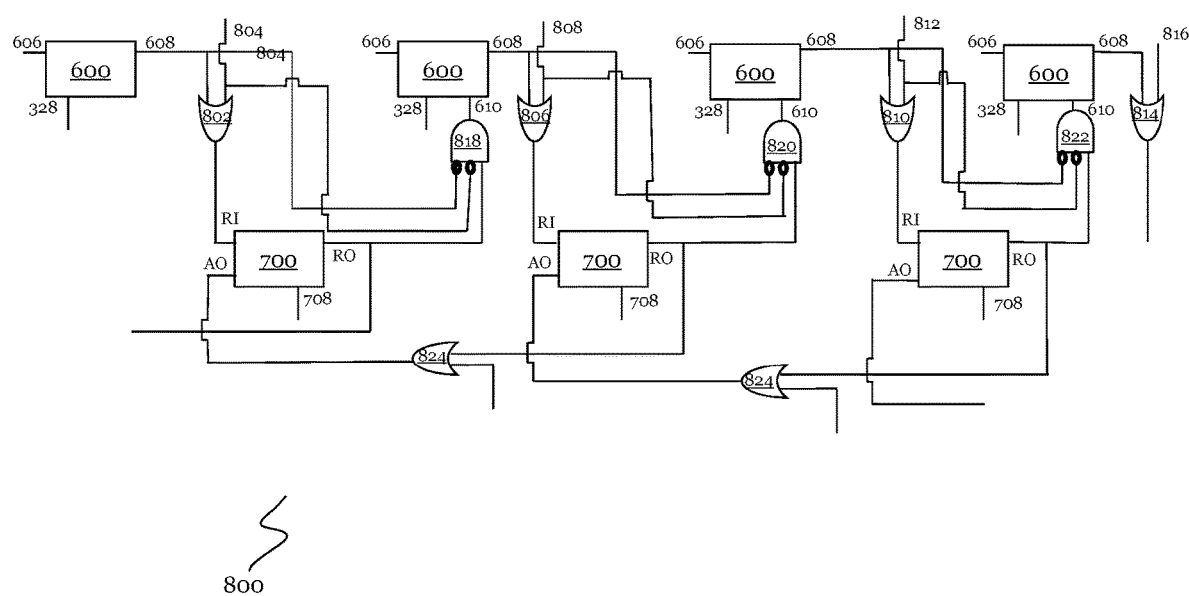
FIG. 8 depicts an arrangement of ARC Cells and State Cells in accordance with embodiments.

FIG. 8 depicts an arrangement of ARC Cells and State Cells in accordance with an embodiment.

To avoid redundancy, explanation for elements in FIG. 8 discussed elsewhere in this disclosure will not be repeated here. Internal logic 800 of an AFSM may comprise a plurality of ARC cells and state cells. ARC cells may comprise ARC cells 600, but other ARC cells may be utilized. State cells may comprise state cells 700, but other state cells may be utilized. Each ARC cell 600 depicted in FIG. 8 may correspond to a potential ARC for an AFSM. Similarly, each state cell 700 may correspond to a state of an AFSM. As mentioned, there may be more than one possible transition into a given state. A transition signals 608 from an ARC cell 600 can thus be provided to an OR gate. For example OR gate 802, may receive a transition signal 608 as well as additional transition signals 804. The output of the OR gate 802 may then be provided to a state cell 700. As will be appreciated the internal logic 800 may also comprise OR gate 806, OR gate 810, and OR gate 814. Each may receive a transition signal 608 from an ARC cell 600 and additional transition signals (such as transition signals 808, transition signal 812, and transition signals 816) which may originate from ARC cells not depicted in FIG. 8.

In various embodiments, the confirmation signal 610 for an ARC cell may be received from an AND gate that receives the output RO of a state cell as well as one or more inverted transition signals. For example AND gate 818, AND gate 820, and AND gate 822 may each output a confirmation signal 610 to a respective ARC cell.

The output RO of a state cell 700 may also be provided to an OR gate (along with outputs from other state cells). The output of such an OR gate may be provided as the acknowledgment signal for a state cell. In various embodiments, AFSM 302 may comprise internal logic 800. The acknowledgement signal may go to "1" when a state transition has occurred, this "1" may be propagated to the source state in order to acknowledge that there is a new current state, so the RO signal of the source state goes to "0" in response to the acknowledgement signal.

As will be appreciated, testing the transitions with test data can detect stuck-at faults in an AFSM where a logic component is unable to switch from one binary state to another. Testing an AFSM, as described in this disclosure, may reveal unexpected pierced state faults, where a subsequent transition occurs after a transition from an initial state to a target state. For example, if test data is provided to an AFSM that causes the AFSM to transition from an initial state S0 to a first state S1 and the AFSM also transitions to a third state S3 due to a stuck-at fault, this may be referred to as an unexpected pierced state.

Testing may also reveal stuck-at fault that prevent an AFSM from transitioning properly out of a given state. For example, a stuck-at fault may cause an AFSM to remain in an initial state even after it should have been triggered out of that state by data received by the AFSM. Finally, a stuck-at fault may cause an AFSM to comprise more than one state at a time. This may be referred to as a default state.

A test conducted in accordance with embodiments of this disclosure may detect stuck-at faults at the various inputs and outputs for state cells and ARC cells. This may provide comprehensive stuck-at fault detection for an AFSM. For illustrative purposes, this will be detailed with examples from state cell 700 and ARC cell boo. However, this may be utilized with other ARC cell embodiments and state cell embodiments. Each of the following examples may be detected after test data is loaded to trigger a transition and the state of the AFSM is checked, for example by reading output scanned out of an output register 340.

Taking a state cell 700, a stuck at "0" fault at the input RI may prevent an AFSM from transitioning to a destination state. This may be determined by reading the state signal data (for example, scanned out from output register 340) and determining that the AFSM did not transition to an expected destination state (it remained in the preceding state). A stuck at "1" fault at the input RI of a state cell 700 may cause a default state. This may be detected by reading the state signal data (for example, scanned out from output register 340) and determining that it indicates that the AFSM comprises more than one state.

A stuck at "1" fault at the acknowledgment signal AO may prevent an AFSM from transitioning to a destination state. This may be determined by reading the state signal data (for example, scanned out from output register 340) and determining that the AFSM did not transition to an expected destination state (it remained in the preceding state). A stuck at "0" fault at the acknowledgment signal AO of a state cell 700 may cause a default state. This may be detected by reading the state signal data (for example, scanned out from output register 340) and determining that it indicates that the AFSM comprises more than one state.

A stuck at "0" fault at the output signal RO may prevent an AFSM from transitioning to a destination state. This may be determined by reading the state signal data (for example, scanned out from output register 340) and determining that the AFSM did not transition to an expected destination state (it remained in the preceding state). A stuck at "1" fault at the output signal RO of a state cell 700 may cause a default state. This may be detected by reading the state signal data (for example, scanned out from output register 340) and determining that it indicates that the AFSM comprises more than one state.

A stuck at "0" fault at the RESET signal 708 may prevent an AFSM from transitioning to a destination state. This may be determined by reading the state signal data (for example, scanned out from output register 340) and determining that the AFSM did not transition to an expected destination state (it remained in the preceding state). In various embodiment a stuck at "1" fault at the acknowledgment signal reset a state cell 700 may be detected by setting the AFSM to the corresponding state and triggering a reset. If the AFSM is able to reset out of the given state, then it may confirm that there is no stuck at "1" fault at the reset signal 708. As will be appreciated, this may be accomplished by toggling a reset signal (such as reset signal 336) for an AFSM 302. This may be detected by reading the state signal data (for example, scanned out from output register 340) and determining that it indicates that the AFSM comprises more than one state.

Taking an ARC cell 600, a stuck at "0" fault at the confirmation signal 610 may prevent an ARC cell 600 from being triggered to produce a transition signal. As a result, an AFSM may not transition out of a given state in response to triggering input designed to trigger the ARC cell with the fault. This may be determined by reading the state signal data (for example, scanned out from output register 340) and determining that the AFSM did not transition to an expected destination state (it remained in the preceding state). A stuck at "1" fault at the confirmation signal bio may create a default state in an AFSM. This may be detected by reading the state signal data (for example, scanned out from output register 340) and determining that it indicates that the AFSM comprises more than one state.

A stuck at "0" fault at the ARC Signal 606 may prevent an ARC cell 600 from being triggered to produce a transition signal. As a result, an AFSM may not transition out of a given state in response to triggering input designed to trigger the ARC cell with the fault. This may be determined by reading the state signal data (for example, scanned out from output register 340) and determining that the AFSM did not transition to an expected destination state (it remained in the preceding state). A stuck at "1" fault at the ARC Signal 606 may create an unexpected pierced state an AFSM. This may be detected by reading the state signal data (for example, scanned out from output register 340) and determining that the AFSM has transitioned out of an expected state to a next state.

A stuck at "0" fault at the transition signals 608 may prevent an ARC cell 600 from being triggered to produce a transition signal. As a result, an AFSM may not transition out of a given state in response to triggering input designed to trigger the ARC cell with the fault. This may be determined by reading the state signal data (for example, scanned out from output register 340) and determining that the AFSM did not transition to an expected destination state (it remained in the preceding state). A stuck at "1" fault at the transition signals 608 may create a default state in an AFSM. This may be detected by reading the state signal data (for example, scanned out from output register 340) and determining that it indicates that the AFSM comprises more than one state.

A stuck at "0" fault at the disable signal 328 may prevent an ARC cell 600 from being triggered to produce a transition signal. As a result, an AFSM may not transition out of a given state in response to triggering input designed to trigger the ARC cell with the fault. This may be determined by reading the state signal data (for example, scanned out from output register 340) and determining that the AFSM did not transition to an expected destination state (it remained in the preceding state). A stuck at "1" fault at the disable signal 328 may prevent the state of an AFSM from being fixed while data is being shifted in during a test. This can be detected by monitoring the state signal while data is being loaded with transitions disabled and determine whether transitions occur.

As has been explained above, using the disable signal and loading test data to test an AFSM can detect all potential stuck-at faults in ARC cells and state cells (such as ARC cell 600 and state cell 700). This provides more efficient and accurate testing capabilities for AFSMs.

The location of stuck-at faults may also be determined for unexpected pierced states and faults that cause an AFSM to remain in a given state. Location of default states may be detected using one hot encoding of the states to detect region of interest for default states (location of stuck-at fault).

In various embodiments, test patterns should be generated so that each possible ARC from each state is tested so that all potential stuck-at faults are tested. In various embodiments, a graph algorithm may be utilized in view of the states of an AFSM and the ARC, which define an AFSM. This can be used to determine each data input that may be required so that each possible state and ARC is tested (such as a Karnaugh Map Solver so, for each ARC there is corresponding test data input that allows one ARC out of a given state and no ARCs out of the expected state). Finally, a pattern for the input of the data may be generated for determining the most efficient sequence for a comprehensive test.

For example, data may input while transitions are to test a first arc out of an initial state. Transitions may be enabled and the results recorded. Transitions may be disabled again and data input to test a different ARC. Transitions may be enabled and the results recorded. In addition, this may be carried on until all ARC and states are tested. A graph algorithm may be used to determine the different inputs for testing and the pattern generation may be used to determine the order of the sequence for inputting that data.

Figure 9:
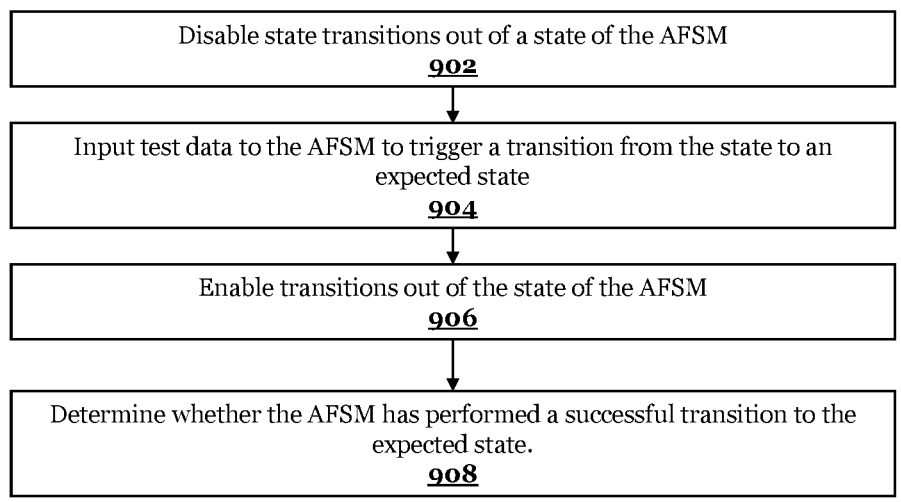
FIG. 9 depicts A method to test an AFSM for faults in accordance with embodiments.

FIG. 9 depicts a method to test an asynchronous finite state machine for faults, in accordance with embodiments.

In various embodiments, the method 900 may comprise at a step 902, disabling state transitions out of a state of the AFSM; at a step 904, inputting test data to the AFSM to trigger a transition from the state to an expected state; at a step 906, enabling transitions out of the state of the AFSM; and at a step 908, determining whether the AFSM has performed a successful transition to the expected state.

In various embodiments the method 900 may further comprise, wherein determining whether the AFSM has performed the successful transition to the expected state comprises determining whether the AFSM is in the expected state and no other states.

In various embodiments the method 900 may further comprise, determining that the successful transition was not performed and concluding that the AFSM comprises a stuck-at fault.

In various embodiments the method 900 may further comprise, wherein determining whether the AFSM has performed the successful transition to the expected state comprises disabling all state transitions of the AFSM and reading state signals scanned out of the AFSM that indicate whether the AFSM is in the expected state.

In various embodiments the method 900 may further comprise, wherein the test data is selected to prevent all transitions out of the expected state.

In various embodiments the method 900 may further comprise, wherein disabling state transitions comprises disabling all state transitions of the AFSM using a disable signal.

In various embodiments the method 900 may further comprise, wherein inputting test data comprises serially inputting into a test register in a shift mode.

In various embodiments the method 900 may further comprise, wherein disabling state transitions out of the state simultaneously converts the test register from the shift mode to a capture mode.

In various embodiments the method 900 may further comprise, determining whether the AFSM has performed the successful transition to the expected state comprises reading state signals stored in an output register and serially scanned out of the AFSM while state transitions of the AFSM are disabled.

In various embodiments the method 900 may further comprise, repeating the method for each possible transition from each state of the AFSM.

Example 1. A method to test an asynchronous finite state machine (AFSM) for faults including: disabling state transitions out of a state of the AFSM; inputting test data to the AFSM to trigger a transition from the state to an expected state; enabling transitions out of the state of the AFSM; and determining whether the AFSM has performed a successful transition to the expected state.

Example 2. The method of Example 1, wherein determining whether the AFSM has performed the successful transition to the expected state includes determining whether the AFSM is in the expected state and no other states.

Example 3. The method of Example 1 or Example 2, further including determining that the successful transition was not performed and concluding that the AFSM includes a stuck-at fault.

Example 4. The methods of Example 1 through Example 3, wherein determining whether the AFSM has performed the successful transition to the expected state includes disabling all state transitions of the AFSM and reading state signals scanned out of the AFSM that indicate whether the AFSM is in the expected state.

Example 5. The methods of Example 1 through Example 4, wherein the test data is selected to prevent all transitions out of the expected state.

Example 6. The methods of Example 1 through Example 5, wherein disabling state transitions includes disabling all state transitions of the AFSM using a disable signal.

Example 7. The methods of Example 1 through Example 6, wherein inputting test data includes serially inputting into a test register in a shift mode.

Example 8. The methods of Example 1 through Example 7, wherein disabling state transitions out of the state simultaneously converts the test register from the shift mode to a capture mode.

Example 9. The methods of Example 1 through Example 8, whether determining whether the AFSM has performed the successful transition to the expected state includes reading state signals stored in an output register and serially scanned out of the AFSM while state transitions of the AFSM are disabled.

Example 10. The methods of Example 1 through Example 9, further including repeating the method for each possible transition from each state of the AFSM.

Example 11. An asynchronous finite state machine including: a state cell configured to store a value after receiving a transition signal; and an ARC cell configured to produce the transition signal, the asynchronous finite state machine being configured to disable generation of the transition signal when a disable signal is received by the asynchronous finite state machine.

Example 12. The asynchronous finite state machine of Example 11, wherein the ARC cell is configured to receive the disable signal.

Example 13. The asynchronous finite state machine of Example 11 or Example 12, wherein the ARC cell includes an AND gate configured to receive the disable signal and the transition signal.

Example 14. The asynchronous finite state machines of Example 11 through Example 13, wherein the ARC cell includes an OR gate configured to receive a trigger signal and receive an output of the AND gate, the transition signal being produced at an output of the OR gate.

Example 15. A testing system including an asynchronous finite state machine (AFSM) having an initial state, the asynchronous finite state machine being configured to transition from the initial state to a destination state in response to receiving triggering data; a test register configured to provide triggering data to the AFSM during a test mode of the testing system; and an output register coupled with the AFSM to receive state signals from the AFSM that change in response a state transition of the AFSM, the AFSM being configured to disable state transition signals in response to assertion of a disable signal received by the AFSM.

Example 16. The testing system of Example 15, wherein the testing system is configured to assert the disable signal while triggering data is serially loaded into the test register.

Example 17. The testing system of Example 15 or Example 16, wherein the output register is configured to serially output data while triggering data is serially loaded into the test register.

Example 18. The testing systems of Example 15 through Example 17, further including a selection port coupled with the test register to provide a selection signal, the test register configured to switch between a shift mode and a capture mode depending on the selection signal.

Example 19. The testing systems of Example 15 through Example 18, wherein the testing system is configured to invert the selection signal to produce the disable signal.

Example 20. The testing systems of Example 15 through Example 19, further including at least one MUX coupled with the test register, the at least one MUX configured to output data received from the test register to the AFSM during the test mode.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method to test an asynchronous finite state machine (AFSM) for faults, the method comprising:
   disabling state transitions out of a state of the AFSM for a duration corresponding to loading of test data into a test register of a system, the system used to test the AFSM;
   inputting the test data to the AFSM to trigger a transition from the state to an expected state; and
   determining whether the AFSM has performed a successful transition to the expected state.

2. The method of claim 1, wherein determining whether the AFSM has performed the successful transition to the expected state comprises determining whether the AFSM is in the expected state and no other states.

3. The method of claim 2, further comprising determining that the successful transition was not performed and concluding that the AFSM comprises a stuck-at fault.

4. The method of claim 1, wherein determining whether the AFSM has performed the successful transition to the expected state comprises disabling all state transitions of the AFSM and reading state signals scanned out of the AFSM that indicate whether the AFSM is in the expected state.

5. The method of claim 1, wherein the test data is selected to prevent all transitions out of the expected state.

6. The method of claim 1, wherein disabling state transitions comprises disabling all state transitions of the AFSM using a disable signal.

7. The method of claim 1, wherein inputting the test data comprises serially inputting into the test register in a shift mode.

8. The method of claim 7, wherein disabling state transitions out of the state simultaneously converts the test register from the shift mode to a capture mode.

9. The method of claim 1, whether determining whether the AFSM has performed the successful transition to the expected state comprises reading state signals stored in an output register and serially scanned out of the AFSM while state transitions of the AFSM are disabled.

10. The method of claim 1 further comprising repeating the method for an associated transition from a respective state of the AFSM.

11. An asynchronous finite state machine, comprising:
a state cell configured to store a value after receiving a transition signal; and
an ARC cell configured to produce the transition signal, the asynchronous finite state machine being configured to disable generation of the transition signal in response to receiving a disable signal by the asynchronous finite state machine, the disable signal being asserted for a duration corresponding to loading of test data into a test register of a system used to test the asynchronous finite state machine.

12. The asynchronous finite state machine of claim 11, wherein the ARC cell is configured to receive the disable signal.

13. The asynchronous finite state machine of claim 11, wherein the ARC cell comprises an AND gate configured to receive the disable signal and the transition signal.

14. The asynchronous finite state machine of claim 13, wherein the ARC cell comprises an OR gate configured to receive a trigger signal and receive an output of the AND gate, the transition signal being produced at an output of the OR gate.

15. A testing system, comprising:
an asynchronous finite state machine (AFSM) having an initial state, the asynchronous finite state machine being configured to transition from the initial state to a destination state in response to receiving triggering data;
a test register configured to provide triggering data to the AFSM during a test mode of the testing system; and
an output register coupled with the AFSM to receive state signals from the AFSM that change in response to a state transition of the AFSM, the AFSM being configured to disable state transition signals in response to assertion of a disable signal received by the AFSM, the disable signal being asserted for a duration corresponding to loading of test data into the test register.

16. The testing system of claim 15, wherein the testing system is configured to assert the disable signal while triggering data is serially loaded into the test register.

17. The testing system of claim 16, wherein the output register is configured to serially output data while triggering data is serially loaded into the test register.

18. The testing system of claim 16, further comprising a selection port coupled with the test register to provide a selection signal, the test register configured to switch between a shift mode and a capture mode depending on the selection signal.

19. The testing system of claim 18, wherein the testing system is configured to invert the selection signal to produce the disable signal.

20. The testing system of claim 15, further comprising at least one MUX coupled with the test register, the at least one MUX configured to output data received from the test register to the AFSM during the test mode.

\* \* \* \* \*